United States Patent
Buchanan

(10) Patent No.: US 9,806,736 B2
(45) Date of Patent: Oct. 31, 2017

(54) SWITCHED MEMRISTOR ANALOG-TO-DIGITAL CONVERSION

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/116,095

(22) PCT Filed: Apr. 26, 2014

(86) PCT No.: PCT/US2014/035586
§ 371 (c)(1),
(2) Date: Aug. 2, 2016

(87) PCT Pub. No.: WO2015/163928
PCT Pub. Date: Oct. 29, 2015

(65) Prior Publication Data
US 2017/0134038 A1 May 11, 2017

(51) Int. Cl.
*H03M 1/00* (2006.01)
*H03M 1/80* (2006.01)
*H03M 1/78* (2006.01)
*H01L 45/00* (2006.01)

(52) U.S. Cl.
CPC ........ *H03M 1/808* (2013.01); *H01L 45/1253* (2013.01); *H01L 45/145* (2013.01); *H03M 1/785* (2013.01)

(58) Field of Classification Search
CPC ............ H03M 1/80; H03M 1/78; H03M 1/66; H03M 1/68; H03M 2201/814; H03M 1/747; H01L 45/00
USPC ........................................ 341/136, 144, 172
See application file for complete search history.

(56) References Cited

U.S. PATENT DOCUMENTS

| | | | |
|---|---|---|---|
| 6,225,933 B1 | 5/2001 | Salter et al. | |
| 7,439,764 B2 * | 10/2008 | Twigg | H03K 19/173 326/38 |
| 7,755,424 B2 * | 7/2010 | Mouttet | H03F 1/34 330/144 |
| 7,830,693 B2 | 11/2010 | Liu et al. | |
| 7,876,597 B2 | 1/2011 | Liu | |

(Continued)

OTHER PUBLICATIONS

Gao et al., "Digital-to-Analog and Analog-to-Digital Conversion with Metal Oxide Memristors for Ultra-Low Power Computing," IEEE/ACM Int Symposisum on Nanoscale Architectures (NANOARCH), 2013, pp. 19-22.

(Continued)

*Primary Examiner* — Jean B Jeanglaude
(74) *Attorney, Agent, or Firm* — North Shore Associates

(57) ABSTRACT

Switched memristor digital-to-analog conversion employs a set of switch-selectable programmed resistances corresponding to a digital-to-analog conversion mapping to convert a digital input into an analog output. The digital input is to establish an analog resistance of a plurality of switched memristors connected in series that are switch selectable. The plurality of switched memristors is to provide the set of switch-selectable programmed resistances in accordance with the digital-to-analog conversion mapping.

15 Claims, 4 Drawing Sheets

(56) References Cited

U.S. PATENT DOCUMENTS

| | | | |
|---|---|---|---|
| 7,957,207 B2 | 6/2011 | Parkinson | |
| 7,969,186 B2 * | 6/2011 | Heaton | H03K 19/17704 257/296 |
| 8,331,127 B2 | 12/2012 | Chen et al. | |
| 8,477,055 B2 | 7/2013 | Choi et al. | |
| 8,737,113 B2 * | 5/2014 | Yang | G11C 13/0002 365/148 |
| 2002/0097598 A1 | 7/2002 | Hoenigschmid | |
| 2007/0121369 A1 | 5/2007 | Happ | |
| 2011/0182104 A1 | 7/2011 | Kim et al. | |
| 2011/0279135 A1 | 11/2011 | Borghetti et al. | |
| 2012/0013306 A1 | 1/2012 | Kadirvel et al. | |
| 2012/0044742 A1 | 2/2012 | Narayanan | |
| 2012/0194967 A1 | 8/2012 | Keane et al. | |
| 2013/0106462 A1 | 5/2013 | Yang et al. | |

OTHER PUBLICATIONS

International Searching Authority, The International Search Report and the Written Opinion, PCT/US2014/035586, dated Jan. 23, 2015, 13 Pgs.

Pershin et al., "Practical approach to programmable analog circuits with memristors," IEEE Trans Circuits and Systems I: Regular Papers, V. 57, N. 8, 2010, pp. 1857-1864.

Pershin, Y.V. et al., Analog-to-digital and Digital-to-analog Conversion with Memristive Devices, Dept. of Phys & Astron., Univ. of South Carolina, Columbia, SC, USA, Jan. 19, 2012, on pp. 73-74.

Zangeneh et al., "Design and Optimization of Nonvolatile Multibit 1T1R Resistive RAM," IEEE Transactions on Very Large Scale Integration (VLSI) Systems, V.PP, N. 99, 2013; pp. 1-14.

* cited by examiner

SWITCHED MEMRISTOR ANALOG-TO-DIGITAL CONVERSION

CROSS-REFERENCE TO RELATED APPLICATIONS

N/A

STATEMENT REGARDING FEDERALLY SPONSORED RESEARCH OR DEVELOPMENT

N/A

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level or state that is a function substantially of bias history. In particular, a bias (e.g., a voltage or a current) applied across terminals of the memristor may be used to set, select or program a resistance of the memristor. Once programmed, the memristor may retain the programmed resistance for a specified period of time after the bias is removed (e.g., until reprogrammed). As such, a memristor is a two-terminal device that may function as a non-volatile memory where the programmed resistance is substantially stored without the application of power to the memristor.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide conversion of a digital input into an analog output using a memristor-based set of switch-selectable programmed analog resistances. In particular, the memristor-based set of switch-selectable programmed resistances provides digital-to-analog conversion mapping. As such, examples of the principles described herein provide a digital-to-analog conversion based on the digital-to-analog conversion mapping determined by the memristor-based set of switch-selectable programmed resistances. Further, according to various examples of the principles described herein, the set of switch-selectable programmed resistances is provided by memristors that may be reprogrammed. Reprogramming allows the digital-to-analog conversion mapping to be changed in situ, for example.

Figure 1:
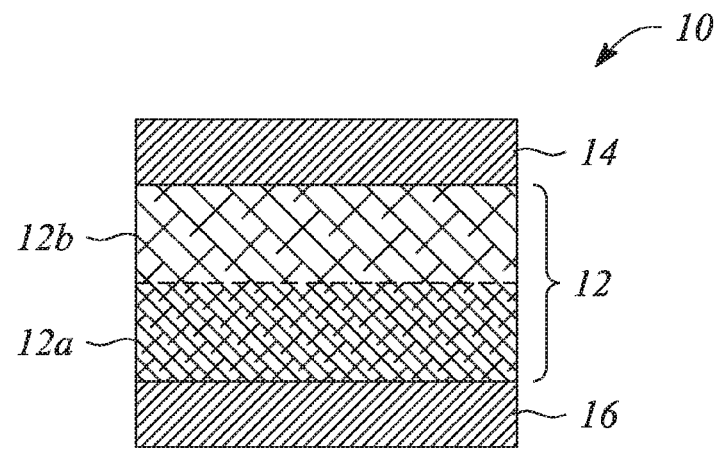
FIG. 1 illustrates a cross sectional view of a memristor, according to an example consistent with the principles described herein.

FIG. 1 illustrates a cross sectional view of a memristor 10, according to an example consistent with the principles described herein. As illustrated, the memristor 10 is a two terminal device including a layer 12 of a memristor switching material, also referred to as a memristor matrix or switching matrix of the memristor 10. By definition herein, the 'memristor switching material' is a material that exhibits a switching phenomenon or characteristic when subjected to a stimulus (e.g., a voltage or a current). The memristor matrix layer 12 is disposed or 'sandwiched' between a first or 'top' electrode 14 and a second or 'bottom' electrode 16. The first and second electrodes 14, 16 facilitate applying a stimulus or 'programming signal' to affect a change in the memristor matrix layer 12. According to some examples, one or both of the first electrode 14 and the second electrode 16 may also participate in the switching phenomenon of the memristor matrix (e.g., as a donor or acceptor of a dopant).

In various examples, the memristor matrix layer 12 of the memristor 10 may include any of a variety of oxides, nitrides and even sulfides that can be formed into a layer between a pair of electrodes. For example, titanium oxide ($TiO_2$) may be used as the oxide layer in a memristor. Other oxides that may be employed include, but are not limited to, hafnium oxide, nickel oxide, nickel oxide doped with chromium, strontium titanate, chromium doped strontium titanate, tantalum oxide, niobium, and tungsten oxide, for example. Nitrides used as a nitride layer of a memristor include, but are not limited to, aluminum nitride and silicon nitride. In addition, other compounds including, but not limited to, antimony telluride, antimony germanium telluride and silver-doped amorphous silicon may be employed, for example.

In some examples, the memristor matrix layer 12 may include a crystalline oxide (e.g., an oxide layer). In other examples, the memristor matrix layer 12 may include a crystalline nitride (e.g., a nitride layer). In some of these examples, the crystalline oxide or nitride may be monocrystalline. In other examples, the memristor matrix layer 12 includes an amorphous oxide or nitride. In yet other examples, the memristor matrix layer 12 includes either a nanocrystalline oxide or nitride or a microcrystalline oxide or nitride. A nanocrystalline oxide or nitride is an oxide or nitride that includes a plurality of nanoscale crystallites while a microcrystalline oxide or nitride may include crystallites having sizes in the micron range, for example.

In some examples, the memristor matrix layer 12 may include a plurality of layers. A first layer of the plurality may be a stoichiometric oxide (e.g., $TiO_2$, $HfO_2$, etc.) while a second layer may be an oxygen depleted or oxygen deficient oxide layer (e.g., $TiO_{2-x}$, $HfO_{2-x}$, etc.) where '2-x' denotes an oxygen deficiency, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0. Similarly, a first layer of the plurality of layers of the memristor matrix layer 12 may be a stoichiometric nitride (e.g., AlN, $Si_3N_4$, etc.) while a second layer may be a nitrogen depleted or nitrogen deficient nitride layer (e.g., $AlN_{1-x}$, $Si_3N_{4-x}$, etc.). In some examples, these oxygen deficient or nitrogen deficient layers may be referred to as 'suboxides' or 'subnitrides', respectively.

According to some examples, the change in the memristor matrix layer 12 produced by the programming signal may be understood in terms of oxygen (or nitrogen) migration within the memristor matrix layer 12. For example, a boundary between a layer of memristor matrix material 12b that is deficient in oxygen/nitrogen (e.g., the suboxide/subnitride layer) and another effectively stoichiometric memristor matrix material layer 12a (i.e., oxide/nitride that is not oxygen/nitride deficient) may move as a result of exposure to the programming signal. The movement of the boundary may result from oxygen or nitrogen migration under the influence of the programming signal, for example. A final location of the movable boundary may establish the 'programmed' resistance of the memristor 10, according to some examples.

Alternatively, the change in the memristor matrix layer 12 may also be understood in terms of a formation of current filaments, according to some examples. In either case, a conduction channel may be fainted by the programming signal that results in a change in the programmed resistance of the memristor matrix layer 12 as measured between the first and second electrodes 14, 16. In general, the 'programmed resistance' is substantially an analog resistance (i.e., has a substantially continuous, analog resistance value between a maximum and minimum resistance value). In particular, the 'programmed resistance' may be programmed to exhibit substantially any resistance value between a maximum resistance and a minimum resistance of the memristor 10, by definition herein.

According to various examples, the first and second electrodes 14, 16 include a conductor. For example, the first electrode 14 and the second electrode 16 may include a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first and second electrodes 14, 16.

Additionally, the first and second electrodes 14, 16 may include more than one layer. For example, a layer of Ti may be employed between a Pt-based electrode and a $TiO_2$ based memristor matrix layer 12. The Ti layer may assist in providing an oxygen deficient layer (i.e., $TiO_{2-x}$) in the $TiO_2$ oxide memristor matrix layer 12, for example. In still other examples, materials used in the electrodes 14, 16 may act as a diffusion barrier. For example, titanium nitride (TiN) may be employed as a diffusion barrier (e.g., to prevent material diffusion between the electrodes 14, 16 and the memristor matrix 12).

In some examples, a conductive material of one or both of the first electrode 14 and the second electrode 16 may include a metallic form or constituent of a metal oxide used as the memristor matrix layer 12. For example, a Ti metal may be employed in one or both of the electrodes 14, 16 when the memristor matrix layer 12 includes $TiO_2$. Similarly, one or both of the electrodes 14, 16 may include Ta when the memristor matrix layer 12 includes $Ta_2O_5$. In yet other examples, a refractory material such as tungsten may be used in the electrode(s) 14, 16.

According to various examples, the memristor 10 may provide 'storage' of the programmed resistance. In particular, the programmed resistance may be stored in a non-volatile manner by the memristor 10 by programming a particular resistance, according to some examples. For example, programming may establish a first programmed resistance of the memristor 10. After programming, the memristor 10 may be once again programmed (i.e., reprogrammed) to establish a second programmed resistance that is different from the first programmed resistance, for example. When not being programmed, the memristor 10 may substantially retain the programmed resistance (e.g., even in the absence of applied power).

The memristor 10 may be programmed by passing a current through the memristor 10, according to various examples. In particular, a particular programmed resistance may be programmed or set by application of an external signal referred to herein as a 'programming' signal. The programming signal may include one or both of a voltage and a current that is applied to the memristor 10. For example, the programming signal may be an applied voltage that induces the current through the memristor 10. By definition herein, a 'bipolar' memristor is a memristor in which a polarity of the programming signal (e.g., the applied voltage and, in turn, a direction of the current induced therein) dictates how the programmed resistance of the memristor is affected or changed by the programming signal. For example, a programming signal having a first polarity may increase the programmed resistance, while a programming signal having a second polarity may degrease the programmed resistance of the bipolar memristor. In other examples, the memristor may be 'unipolar' memristor in which a predetermined change in the programmed resistance occurs regardless of or substantially independent of a polarity of the programming signal, by definition herein. In particular, the unipolar memristor has substantially no bias polarity dependence and may be driven by heating or a change temperature, for example.

Herein, the term 'switched' when used as an adjective herein means 'switchable', and in some examples, means that a switch capable of having alternative ON and OFF states is included. For example, a 'switched memristor' includes a memristor and a switch, by definition herein.

Further, as used herein, the article 'a' is intended to have its ordinary meaning in the patent arts, namely 'one or more'. For example, 'a memristor' means one or more memristors and as such, 'the memristor' means 'the memristor(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

Figure 2:
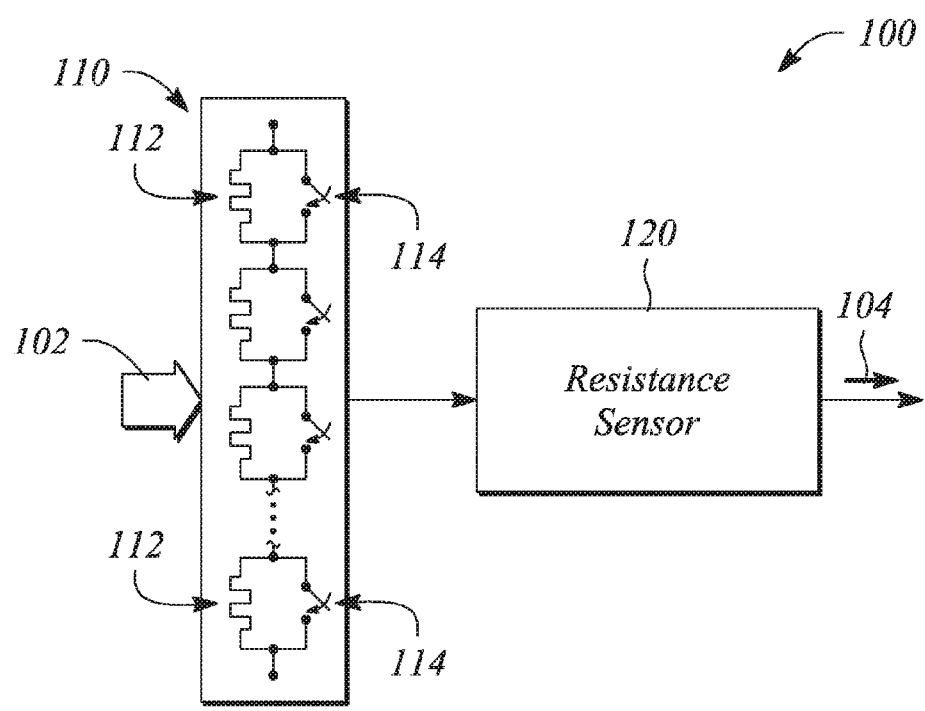
FIG. 2 illustrates a block diagram of a switched memristor digital-to-analog converter (DAC), according to an example consistent with the principles described herein.

FIG. 2 illustrates a block diagram of a switched memristor digital-to-analog converter (DAC) 100, according to an example consistent with the principles described herein. The switched memristor DAC 100 is configured to convert a digital input 102 into a corresponding analog output 104 according to a digital-to-analog conversion mapping. In particular, the digital-to-analog conversion mapping defines a mapping or conversion path from a digital domain of the digital input 102 to an analog domain of the analog output 104. The switched memristor DAC 100 produces the analog output 104 from the digital input 102 using to the digital-to-analog conversion mapping. According to some examples, the analog output 104 may be a signal such as, but not limited to, a voltage that represents the digital input 102 in terms of the digital-to-analog conversion mapping.

According to various examples, the digital-to-analog conversion mapping is determined by a plurality or set of switch-selectable programmed resistances of the switched memristor DAC 100. In particular, the set of switch-selectable programmed resistances includes predetermined programmed resistances to define the digital-to-analog conversion mapping. The predetermined programmed resistances of the set are programmable, according to various examples. Thus, in addition to being provided by the switched memristor DAC 100, the digital-to-analog conversion mapping may be changed in situ by altering or reprogramming the set of predetermined programmed resistances of set of switch-selectable programmed resistances (i.e., reconfigurable digital-to-analog conversion mapping). Moreover, since changing the digital-to-analog conversion mapping enables the switched memristor DAC 100 to be reconfigured, the switched memristor DAC 100 also may be referred to as a 'reconfigurable' DAC, according to various examples of the principles described herein.

The switched memristor DAC 100 illustrated in FIG. 2 includes a plurality of switched memristors 110. The switched memristors 110 are connected in series with one another and are configured to provide a switch-selectable programmed resistance of the set of switch-selectable programmed resistances (i.e., an analog resistance), as is further described below. The series-connected switched memristors 110 of the plurality may be realized as or provided by a one-dimensional (1-D) array of switched memristors 110 (e.g., a switched memristor array), according to some examples. In particular, the series-connected switched memristors 110 of the plurality may be realized as a 'NAND string' or a 'NAND-structured series' of switched memristors. The 'NAND' terminology is due to a similarity with a configuration of switches employed in a 'not-and' or NAND gate, for example.

According to various examples, a switched memristor 110 of the plurality includes a memristor 112 connected in parallel with a switch 114. The memristor 112 of the switched memristor 110 has a programmable resistance configured to provide a programmed resistance of the switch-selectable programmed resistance, according to various examples. In particular, a resistance of the memristor 112 may be programmed to an arbitrary resistance value between a maximum resistance and a minimum resistance of the memristor 112, according to various examples. As such, the 'programmed resistance' of the memristor 112 is an analog resistance that may be programmed (e.g., by a programming signal) into the memristor 112, by definition herein. Further by definition herein, the 'analog resistance' of the memristor 112 may be an arbitrary, resistance value as opposed to a particular resistance value chosen from among a plurality of discrete resistance values such as in a multi-level memristor memory, for example.

According to various examples, the memristor 112 is programmed by the application of a programming signal to the memristor 112. The programming signal may include one or both of a programming voltage applied to and a programming current flowing through the memristor 112, for example. Once programmed, the programmable resistance of the memristor 112 provides the predetermined programmed resistance of the set of switch-selectable programmed resistances, according to various examples. Further, the programmed resistance is substantially maintained by the memristor 112 after being programmed, according to various examples. In particular, the memristor 112 may 'store' the programmed resistance in a substantially non-volatile manner in the absence of an applied power source (e.g., a voltage source, current source, etc.). Further, the programmed resistance is substantially maintained until the memristor 112 is reprogrammed by the application of another programming signal, according to some examples.

The switch 114, which is connected in parallel to the memristor 112, is configured to provide selection of the memristor 112 of the switched memristor 110. In particular, when the switch 114 is 'ON' or closed, the memristor 112 of the switched memristor 110 is substantially bypassed or 'removed from' the plurality of switched memristors 110. For example, an electric current flowing through the plurality of switched memristors 110 connected in series substantially flows primarily through the closed switch 114 of the switched memristor 110 instead of through the bypassed memristor 112 (i.e., the corresponding switch 114 is ON or closed). As a result, the programmed resistance of the bypassed memristor 112 generally does not contribute in a substantial manner to a total resistance (i.e., a resistance of the set of switch-selectable programmed resistances) of the plurality of switched memristors 110. On the other hand, when the switch 114 is 'OFF' or open, the memristor 112 connected in parallel with the switch 114 of the switched memristor 110 is not bypassed. As a result, the programmed resistance of the memristor 112 contributes to the total resistance of the plurality of series-connected switched memristors 110. In FIG. 2, all of the switches 114 of the switched memristors 110 are illustrated as OFF or open by way of example and not limitation. Further, curved arrows within the switches 114 in FIG. 2 illustrate that the switches 114 may be selectively turned ON or closed to bypass one or more of the memristors 112, for example.

In some examples, a binary bit of the digital input 102 may control whether the switch 114 is turned ON or turned OFF. For example, a binary bit having a value of '1' may turn ON the switch 114, while a binary bit having a value of '0' may result in the switch 114 being turned OFF. In another example, logic of the digital input 102 may be reversed or inverted. For example, a binary bit having a value of '0' may turn ON the switch 114 and binary bit having a value of '1' may turn OFF the switch 114. In general, the binary logic employed may depend on a type of switch 114 as well as any switch drivers (e.g., inverted vs. non-inverted switch drivers) that may be employed, for example. Herein, a binary bit value of '1' will be assumed to turn ON the switch 114 (i.e., close the switch) and a binary bit value of '0' will be assumed to turn OFF the switch 114 (i.e., open the switch), by way of example and not limitation.

According to some examples, the switch 114 may be or include a solid-state switch such as, but not limited to, a field effect transistor (FET). For example, the switch 114 may include a FET with a source of the FET connected to a first terminal of the memristor 112 and a drain of the FET connected to a second terminal of the memristor 112. The FET may be an n-channel or a p-channel FET (e.g., an n-channel or a p-channel metal-oxide FET or MOSFET), according to some examples. The switch 114 that is or that includes a FET (e.g., an enhancement mode MOSFET) may be turned ON and OFF by appropriate application of a gate voltage $V_G$ to a gate of the FET. For example, a positive gate voltage $V_G$ may turn ON an n-channel FET when a gate-to-source voltage $V_{GS}$ exceeds a threshold voltage $V_T$ of the n-channel FET (e.g., the n-channel FET is ON for $V_G$ such that $V_{GS} > V_T$). Removal or reduction of the positive gate voltage $V_G$ such that the gate-to-source voltage $V_{GS}$ is less than the threshold voltage $V_T$ may cause the n-channel FET to turn OFF (e.g., the n-channel FET is OFF for $V_G$ such that $V_{GS} < V_T$). A binary bit value of '1' may be represented by the positive gate voltage $V_G$ that exceeds the threshold voltage $V_T$, while a binary bit value of '0' may represent removal of the gate voltage $V_G$ (e.g., $V_G \sim 0$ Volts), for example. In another example using a different type of FET (e.g., a depletion mode MOSFET), application of the gate voltage $V_G$ may turn OFF the FET while removal of the gate voltage $V_G$ may turn ON the FET.

Figure 3A:
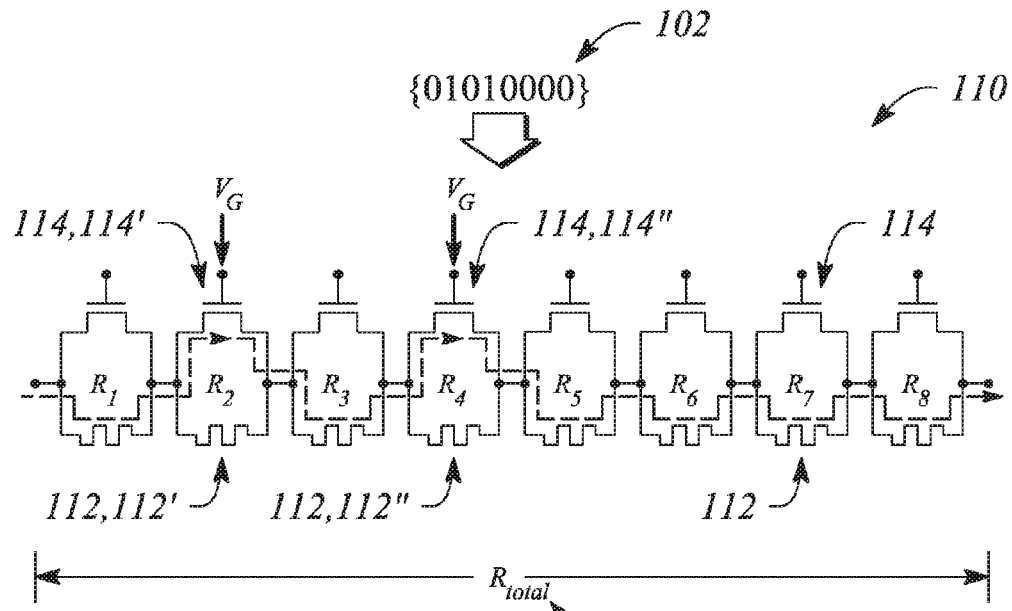
FIG. 3A illustrates a schematic diagram of a plurality of switched memristors connected in series, according to an example consistent with the principles described herein.

FIG. 3A illustrates a schematic diagram of a plurality of switched memristors 110 connected in series, according to an example consistent with the principles described herein. The plurality of switched memristors 110 in FIG. 3A includes eight (8) individual memristors 112 and eight (8) corresponding parallel-connected switches 114 to make up eight (8) switched memristors 110, by way of example and not limitation. The eight (8) switches 114 of the eight (8) switched memristors 110 are FET switches, as illustrated. The eight (8) switched memristors 110 of the plurality illustrated in FIG. 3A may be used to provide digital-to-analog conversion mapping of an 8-bit digital input 102 (e.g., an 8-bit binary word), for example.

In particular, as illustrated in FIG. 3A, the eight (8) individual memristors 112 of the eight (8) respective switched memristors 110 are programmed with eight (8) separate or distinct resistance values $R_1, R_2, \ldots, R_8$, respectively. Other than being between a maximum resistance value $R_{max}$ and a minimum resistance value $R_{min}$ of a respective individual memristor 112, each of the programmed resistance values $R_1, R_2, \ldots, R_8$ may be substantially any, arbitrarily chosen, analog value of resistance. However, according to various examples of the principles described herein, the programmed resistance values $R_1, R_2, \ldots, R_8$ generally are chosen according to the dictates of a particular digital-to-analog conversion mapping. Thus, the eight (8) separate or distinct resistance values $R_1, R_2, \ldots, R_8$ of the individual programmed memristors 112 represent the predetermined programmed resistances of the set of switch-selectable programmed resistances provided by the eight (8) series-connected switched memristors 110.

The digital input 102 corresponding to an 8-bit binary word {01010000} is applied to the eight (8) switched memristors 110, as illustrated in FIG. 3A. As a result, a second switch 114' connected in parallel with a second memristor 112' having a programmed resistance value $R_2$ and a fourth switch 114" connected in parallel with a fourth memristor 112" having a programmed resistance value $R_4$ are turned ON or closed. For example, the second and fourth switches 114', 114" may be turned ON by application of a positive gate voltage $V_G$ corresponding to the '1' bits of the 8-bit binary word {01010000} of the applied digital input 102 in FIG. 3A. As a result, the second and fourth memristors 112', 112" are bypassed, as illustrated.

Since the second and fourth memristors 112', 112" are bypassed, the programmed resistance values $R_2$ and $R_4$ do not contribute to a total resistance of the plurality of switched memristors 110 illustrated in FIG. 3A. In particular, the total resistance $R_{total}$ of the plurality of switched memristors 110 connected in series in FIG. 3A is equal to the sum of the programmed resistance values of the memristors 112 that are not bypassed (i.e., $R_{total} = R_1 + R_3 + R_5 + R_6 + R_7 + R_8$). A dashed line with arrows in FIG. 3A illustrates an electric current path through the plurality of switched memristors 110 in FIG. 3A to emphasize that the second and fourth memristors 112', 112" are bypassed due to the closure of the second and fourth switches 114', 114". In some examples (e.g., as illustrated), $R_{total}$ may be the analog output 104 or substantially equivalent thereto.

Figure 3B:
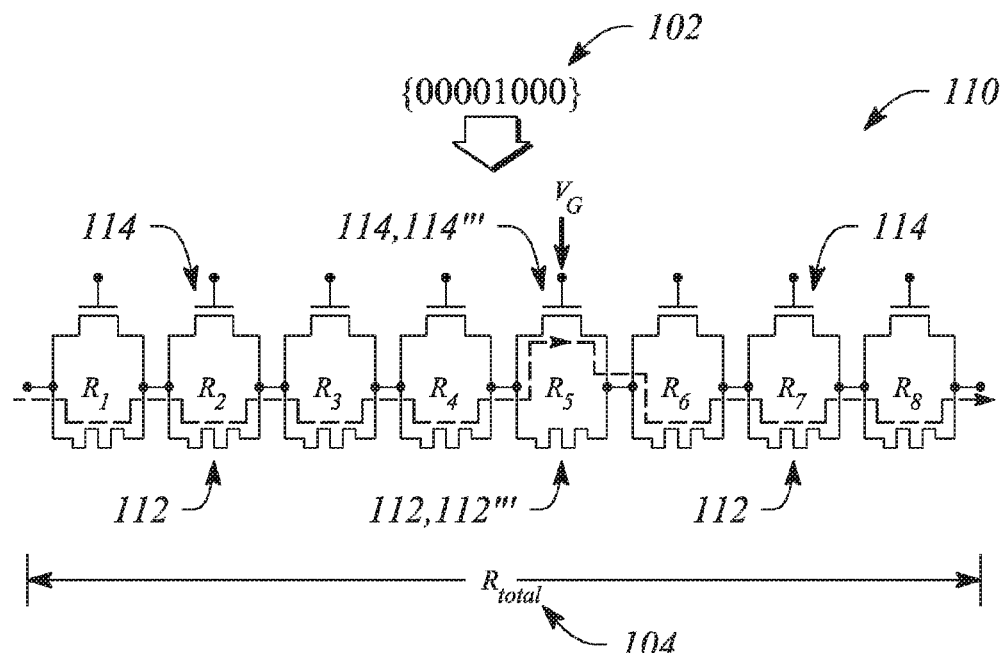
FIG. 3B illustrates a schematic diagram of the plurality of switched memristors of FIG. 3A, according to another example consistent with the principles described herein.

FIG. 3B illustrates a schematic diagram of the plurality of switched memristors 110 of FIG. 3A, according to another example consistent with the principles described herein. In particular, in FIG. 3B, the digital input 102 is changed and may correspond to a binary word {00001000}, wherein only a fifth memristor 112''' is bypassed by a closed fifth switch 114''' using the '1' bit, for example. As illustrated in FIG. 3B, the total resistance $R_{total}$ is a sum of the programmed resistance of all of the memristors 114 except that of the fifth 112''' (i.e., $R_{total} = R_1 + R_2 + R_3 + R_4 + R_6 + R_7 + R_8$). Again, a dashed arrow illustrates an electric current path through the plurality of switched memristors 110 to emphasize the bypassing of the fifth memristor 112''' due to the closure of the fifth switch 114'''. As with FIG. 3A, $R_{total}$ may be the analog output 104 or substantially equivalent thereto, in some examples.

Also note that while programming the memristors 112 (e.g., as illustrated in FIGS. 3A and 3B) may be relatively slow, switching among the plurality of memristors 110 may be accomplished at a speed limited only by a switching speed of the switches 114 (e.g., as opposed to a programming speed of the memristors 112). As such, transitioning from the total resistance $R_{total}$ or the resistance of the set of switch-selectable programmed resistances of the configuration in FIG. 3A to the total resistance $R_{total}$ or the resistance of the set of switch-selectable programmed resistances of the configuration in FIG. 3B may be accomplished very rapidly compared with reprogramming the programmable resistances of individual memristors 112, for example.

In particular, switching the set of switch-selectable programmed resistances between various resistances provided by the predetermined programmed resistances of the eight (8) memristors 112 may be substantially limited only by the switching or activation speed of the switches 114 illustrated in FIGS. 3A and 3B. Therefore, the plurality of switched memristors 110 may provide rapid switching by switch selection, and the conversion of the digital input 102 to an analog output 104 may be limited only by the switching or activation speed of the switches 114, according to various examples.

On the other hand, since the memristor resistance values of the various memristors 112 of the plurality of switched memristors 110 may be programmed and reprogrammed to substantially any analog resistance value between the maximum and minimum resistance values $R_{max}, R_{min}$, the switch-selectable programmed resistance of the plurality of switched memristors 110 is generally not limited to combinations of available predetermined programmed resistances in the set of switch selected programmed resistances (e.g., $R_1, R_2, \ldots, R_8$), for example, when speed is not a limiting factor. As a result, virtually any digital-to-analog conversion mapping may be implemented by reprogramming the memristor resistance values to provide another set of predetermined programmed resistances, for example.

Further, although not explicitly illustrated, it is possible to select a single memristor 112 of the plurality of switched memristors 110 by turning ON the switches 114 of all of the other memristors 112 that are not selected. As a result, all of the non-selected memristors 112 would be bypassed leaving only the selected memristor 112 to contribute to $R_{total}$. Selecting a single memristor 112 may allow programming the selected memristor 112, for example. In particular, a programming signal may be applied to the selected single memristor 112, according to various examples.

According to various examples, the predetermined programmed resistances of the set of selectable programmed resistances may define different digital-to-analog conversion mappings. In particular, in some examples, the digital-to-analog conversion mapping may be a linear weighted mapping. When the digital-to-analog conversion mapping is a linear weighted mapping, the predetermined resistances of the set of switch-selectable programmed resistances may represent a binary linear weight sequence of resistances. By definition, a 'linear weighted mapping' is a mapping in which successive one-bit changes in the digital input 102 produce substantially linear changes in the analog output 104. For example, in a linear weighted mapping, each one-bit increase in the digital input 102 may produce a substantially similar increase in a value of the analog output 104. By definition, a 'binary linear weight sequence' of resistances is a sequence of resistances given by where $2^{n-1} \cdot R$ is an arbitrary resistance and n is an integer ranging from one to N (i.e., n=1, 2, . . . , N).

For example, referring to the set of switch-selectable programmed resistances ($R_1, R_2, R_3, R_4, R_5, R_6, R_7, R_8$) of FIGS. 3A and 3B, a corresponding binary linear weight sequence of resistances may be given by (R, 2·R, 4·R, 8·R, 16·R, 32·R, 64·R, 128·R). Hence, the switched memristors 110 illustrated in FIGS. 3A and 3B may define a digital-to-analog conversion mapping of the digital input 102 by programming the first memristor 112 with a predetermined programmed resistance equal to R (i.e., $R_1$=R), the second memristor 112 with a predetermined programmed resistance equal to two times R (i.e., $R_2$=2·R), and so on up to the eighth memristor 112 with a predetermined programmed resistance equal to one hundred twenty eight times R (i.e., $R_8$=128·R), for example. Note that in other examples of a linear weighted mapping, the binary linear weight sequence of resistances may include resistances that decrease along the sequence from a highest to a lowest resistance (e.g., 128·R, 64·R, 32·R, . . . , R) instead of increasing along the sequence, as described above.

In other examples, the digital-to-analog conversion mapping may be a logarithmic weighted mapping. When the digital-to-analog conversion mapping is a logarithmic weighted mapping, the predetermined resistances of the set of switch-selectable programmed resistances may represent a binary logarithmic weight sequence of resistances. By definition, a 'logarithmic weighted mapping' is a mapping in which successive one-bit changes in the digital input 102 produce substantially logarithmic changes in the analog output 104. By definition, a 'binary logarithmic weight sequence' of resistances is a sequence of resistances related by a logarithmic function. For example, referring to the set of switch-selectable programmed resistances ($R_1, R_2, R_3, R_4, R_5, R_6, R_7, R_8$) of FIGS. 3A and 3B, a corresponding binary logarithmic weight sequence of resistances may be given by (R, 3·R, 10·R, 30·R, 100·R, 300·R, 1000·R, 3000·R). Alternatively, the binary logarithmic weight sequence of resistances may be a decreasing logarithmic function to produce the set of switch-selectable programmed resistances given by (3000·R, 1000·R, 300·R, 100·R, 30·R, 10·R, 3·R, R), for example.

In yet other examples, the digital-to-analog conversion mapping may be virtually any of a wide variety of other mappings. In particular, the digital-to-analog conversion mapping may include an arbitrary weighting (e.g., a weighting that is neither linear nor logarithmic). For example, the digital-to-analog mapping may be a 'coarse-fine' mapping that includes a finer granularity in some regions around gaps with little or no coverage. A set of switch-selectable programmed resistances given by (R, 2·R, 25·R, 50·R, 100·R, 200·R, etc.) may be used, for example. With R equal to 1, this set of switch-selectable programmed resistances may provide a resistance $R_{total}$ that is selectable among values (0, 1, 2, 3, 25, 26, 27, 28, 50, 51, 52, 53, 75, 76, 77, 78, 100, etc.). Note that the value of '0' may be obtained by bypassing all of the memristors 112 of the plurality of switched memristors 110 by turning ON all of the switches 114.

Referring again to FIG. 2, in some examples, the switched memristor DAC 100 further includes a resistance sensor 120 connected to the plurality of switched memristors 110. In some examples, the resistance sensor 120 may be a resistance-sensing circuit. The resistance sensor 120 is configured to sense a resistance (e.g., $R_{total}$) of the set of switch-selectable programmed resistances. The resistance sensor 120 is also configured to provide the analog output 104 of the switched memristor DAC 100 as an output signal that is determined by (e.g., proportional or inversely proportional) to the sensed resistance. In some examples, the resistance sensor 120 includes a voltage sensor to sense a voltage across the plurality of switched memristors 110, the voltage being proportional to the resistance of the set of switch-selectable programmed resistances. In some examples, the voltage sensor provides the output signal or analog output 104 that is proportional to the voltage. In other examples, the resistance sensor 120 includes a current sensor to sense a current flowing through the plurality of switched memristors 110, the current being proportional to the resistance of the set of switch-selectable programmed resistances. In some examples, the output signal or analog output 104 produced by the current sensor is proportional to the current.

Figure 4A:
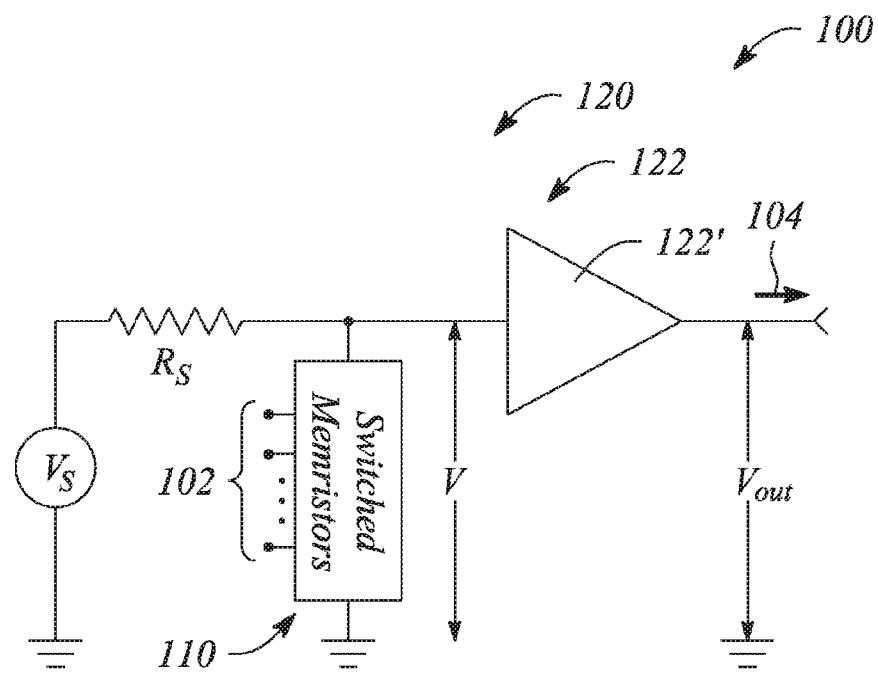
FIG. 4A illustrates a schematic diagram of a switched memristor DAC, according to an example consistent with the principles described herein.
Figure 4B:
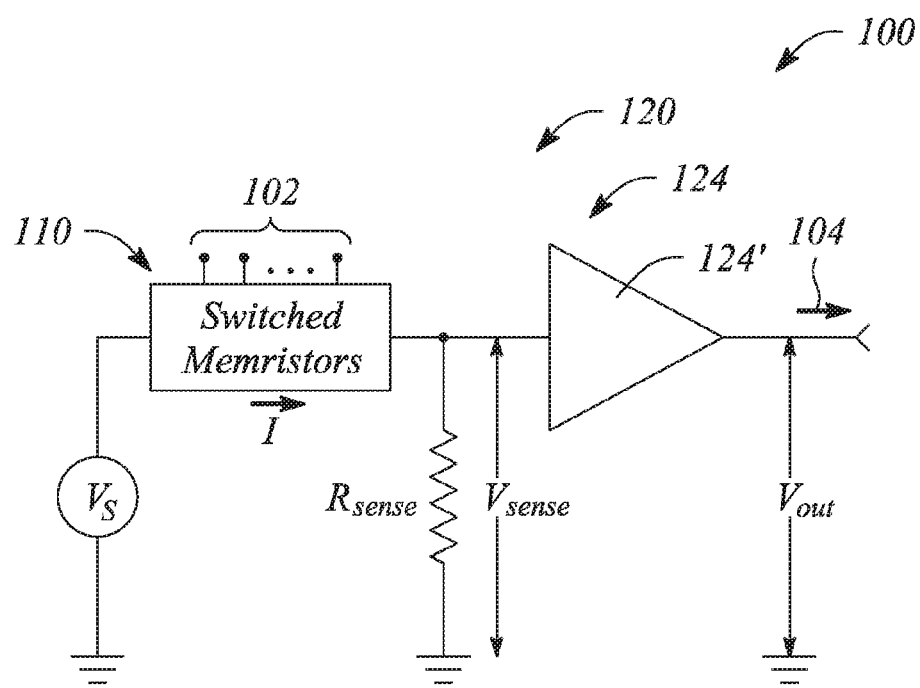
FIG. 4B illustrates a schematic diagram of a switched memristor DAC, according to another example consistent with the principles described herein.

FIG. 4A illustrates a schematic diagram of a switched memristor DAC 100, according to an example consistent with the principles described herein. FIG. 4B illustrates a schematic diagram of a switched memristor DAC 100, according to another example consistent with the principles described herein. In particular, the switched memristor DAC 100 illustrated in FIGS. 4A and 4B includes the plurality of switched memristors 110 and a resistance sensor or resistance-sensing circuit 120. In FIG. 4A, the resistance-sensing circuit 120 includes a voltage sensor 122, while in FIG. 4B the resistance-sensing circuit 120 includes a current sensor 124, as illustrated.

As illustrated in FIG. 4A, the voltage sensor 122 of the resistance-sensing circuit 120 includes a voltage source $V_S$ connected in series with a source resistor $R_S$, and a voltage amplifier 122' (or equivalently, a voltage buffer). The voltage source $V_S$ and series-connected source resistor $R_S$ are connected to the plurality of switched memristors 110 and are configured to produce a voltage V across the switched memristors 110 of the plurality. The switched memristor voltage V is proportional to the resistance of the set of switch selectable programmed resistances (e.g., $R_{total}$) of the plurality of switched memristors according to various examples. The voltage amplifier 122' is configured to detect the switched memristor voltage V and further, is configured to produce an output voltage $V_{out}$ that is proportional to the switched memristor voltage V.

As illustrated in FIG. 4B, the current sensor 124 includes a voltage source $V_S$ connected to the plurality of switched memristors 110. The current sensor 124 further includes a sense resistor $R_{sense}$ connected in series with the plurality of switched memristors 110. The voltage source $V_S$ is configured to induce a current I to flow through plurality of switched memristors 110 and to generate a voltage $V_{sense}$ across the sense resistor $R_{sense}$. The induced current I flowing through the switched memristors 110 is proportional to the resistance of the set of switch selectable programmed resistances (e.g., $R_{total}$), while the voltage $V_{sense}$ across the sense resistor $R_{sense}$ is proportional to the induced current I. The current sensor 124 further includes a voltage amplifier 124' (or equivalently a voltage buffer) connected to detect the voltage $V_{sense}$ across the sense resistor $R_{sense}$ and to produce an output voltage $V_{out}$ that is proportional to the induced current I. As illustrated, the combination of the voltage amplifier 124' and the sense resistor $R_{sense}$ may be viewed as substantially equivalent to a 'current sense amplifier.' The output voltage $V_{out}$ is the analog output 104 of the switched memristor DAC 100 illustrated in FIGS. 4A and 4B, while the digital input 102 controls the resistance of the set of switch selectable programmed resistances of the plurality of switched memristors 110.

Figure 5:
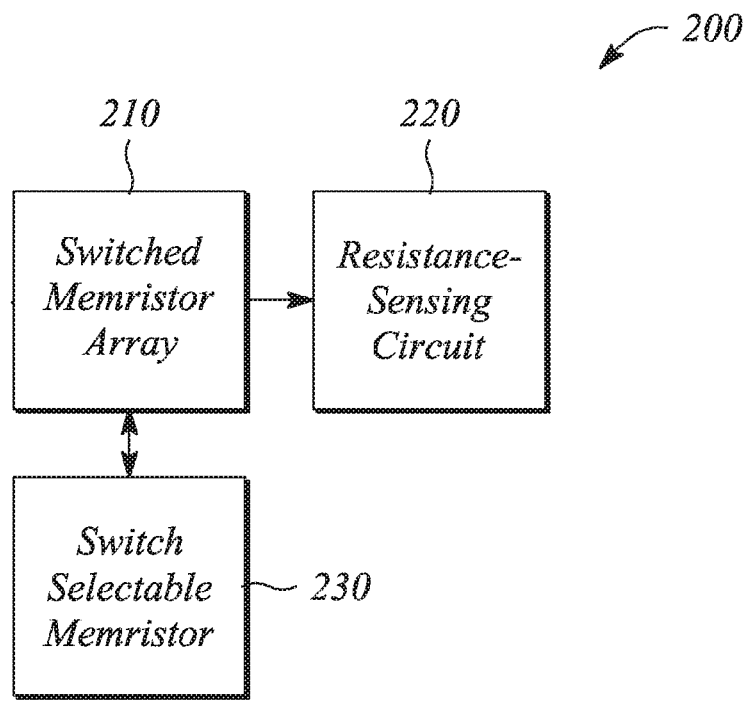
FIG. 5 illustrates a block diagram of a switched memristor digital-to-analog converter (DAC) system, according to an example consistent with the principles described herein.

In some examples of the principles described herein, a switched memristor digital-to-analog converter (DAC) system is provided. FIG. 5 illustrates a block diagram of a switched memristor digital-to-analog converter (DAC) system 200, according to an example consistent with the principles described herein. The switched memristor DAC system 200 of FIG. 5 includes a switched memristor array 210. The switched memristor array 210 includes a plurality of switch selectable memristors. The switched memristor array 210 is configured to provide a set of switch-selectable programmed resistances corresponding to a digital-to-analog conversion mapping of a digital input to an analog output. According to various examples, a resistance of the set of switch-selectable programmed resistances (i.e., an analog resistance) is to be provided by both switch selection of a switch selectable memristor of the plurality and a programmable resistance of the selected switch selectable memristor. Further, switch selection may be according to the digital input, according to various examples. In some examples, the plurality of switch selectable memristors of the switched memristor array 210 as well as individual switch selectable memristors thereof may be substantially similar respectively to the plurality of switched memristors 110 and individual switched memristors 110 of the plurality described above with respect to the switched memristor DAC 100.

In particular, in some examples, the switched memristor array 210 includes the plurality of switch selectable memristors connected in series. In some examples, a switch selectable memristor includes a field effect transistor (FET) connected in parallel with a memristor. A source of the FET may be connected to a first terminal of the memristor and a drain of the FET may be connected to a second terminal of the memristor, for example. The FET may serve as a switch to provide switch selection of the parallel-connected memristor, according to various examples. In other examples, a switch selectable memristor of the switched memristor array 210 may include another type of switch, other than the FET, connected in parallel with the memristor from the first terminal to the second terminal thereof, to provide switch selection of the memristor. The other type of switch may include, but is not limited to, another type of transistor switch and even a non transistor-based switch (e.g., a microelectromechanical system (MEMS) switch), for example.

As illustrated in FIG. 5, the switched memristor DAC system 200 further includes a resistance-sensing circuit 220. The resistance-sensing circuit 220 is connected to the plurality of switch selectable memristors of the switched memristor array 210 to sense the analog resistance of the set of switch-selectable programmed resistances and to provide an output signal determined by or from the sensed resistance. For example, the output signal may be proportional to, inversely proportional to, etc., the sensed resistance. In some examples, the resistance-sensing circuit 220 is substantially similar to the above-described resistance sensor 120 of the switched memristor DAC 100. In particular, the resistance-sensing circuit 220 may include a voltage sense amplifier to sense a voltage across the plurality of switch selectable memristors, the voltage being proportional to the analog resistance of the set of switch-selectable programmed resistances, for example. In another example, the resistance-sensing circuit 220 may include a current sense amplifier (e.g., a voltage amplifier and a sense resistor) to sense a current flowing through the plurality of switch selectable memristors, the current being proportional to the analog resistance of the set of switch-selectable programmed resistances.

In some examples (e.g., as illustrated in FIG. 5), the switched memristor DAC system 200 further includes another switch selectable memristor 230. The other switch selectable memristor 230 is connected to the switched memristor array 210, according to various examples. For example, the other switch selectable memristor 230 may be connected in series with the switched memristor array 210. The other switch selectable memristor 230 may be configured to serve as a spare in the event of a failure of a switch selectable memristor of the switched memristor array 210, according to some examples.

For example, a memristor of a particular switch selectable memristor of the switched memristor array 210 may fail. A switch of the switch selectable memristor may be set to bypass the failed memristor, for example. In turn, the other switch selectable memristor 230 may be programmed to have a programmed resistance that is about equal to the programmed resistance of the failed switch selectable memristor. The other switch selectable memristor 230 may then be used in place of the particular failed switch selectable memristor. In particular, the other switch selectable memristor 230 may contribute to the switch-selectable programmable resistance of the switched memristor array 210 as if it was part of the switched memristor array 210. In other words, the other switch selectable memristor 230 serves as a spare to replace the failed switch selectable memristor.

According to some examples of the switched memristor DAC system 200, the digital-to-analog conversion mapping may be a linear weighted mapping. When the digital-to-analog conversion mapping is a linear weighted mapping, the set of switch-selectable programmed resistances represent a linear weighted sequence of resistances, according to various examples. According to other examples, the digital-to-analog conversion mapping may be a logarithmic weighted mapping. When the digital-to-analog conversion mapping is a logarithmic weighted mapping, the set of switch-selectable programmed resistances represent a logarithmic weighted sequence of resistances, according to various examples. Moreover, according to some examples, the digital-to-analog conversion mapping may be changed from a linear weighted mapping to a logarithmic weighted mapping, and vice versa, by reprogramming memristors of the switched memristor array 210.

Figure 6:
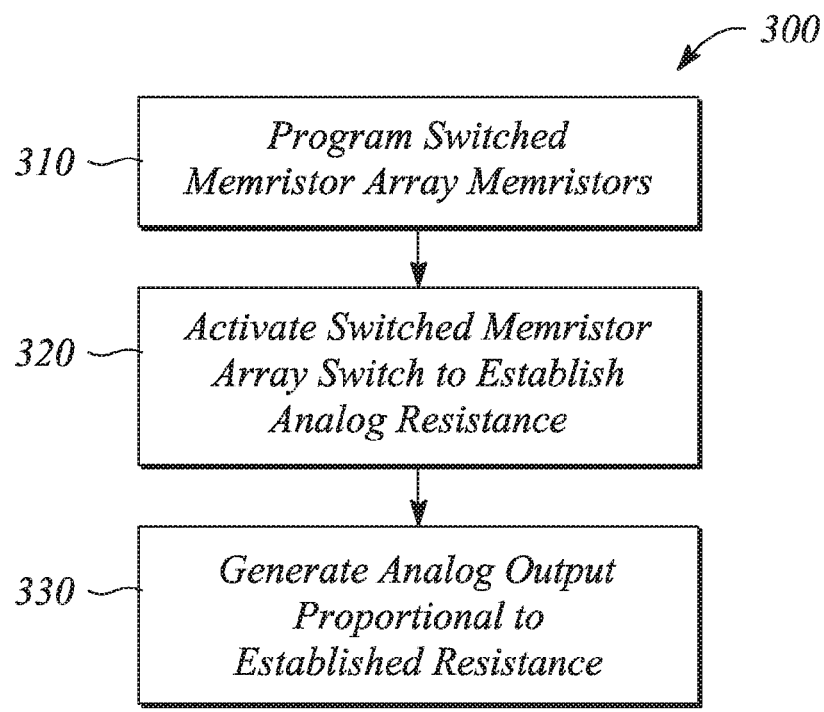
FIG. 6 illustrates a flow chart of a method of digital-to-analog conversion using a switched memristor array, according to an example consistent with the principles described herein.

In some examples of the principles described herein, a method of digital-to-analog conversion is provided. FIG. 6 illustrates a flow chart of a method 300 of digital-to-analog conversion using a switched memristor array, according to an example consistent with the principles described herein. As illustrated, the method 300 of digital-to-analog conversion includes programming 310 memristors of the switched memristor array with a set of switch-selectable programmed resistances to define a digital-to-analog conversion mapping. Programming 310 a memristor includes applying a programming signal to one or more memristors of the switched memristor array, for example. According to some examples, the switched memristor array may be substantially similar to either the plurality of switched memristors 110 (i.e., memristors 112 and switches 114) of the switched memristor DAC 100 or the switched memristor array 210 of the switched memristor DAC system 200, described above.

According to some examples, programming 310 the memristors to define the digital-to-analog conversion mapping includes selecting a set of predetermined analog resistances representing a linear weight sequence of resistances of a linear weight mapping. In other examples, programming 310 the memristors to define the digital-to-analog conversion mapping includes selecting a set of predetermined analog resistances representing a logarithmic weight sequence of resistances of a logarithmic weight mapping. In either example, the memristors are programmed 310 according to the selected set of predetermined analog resistances. In yet other examples, programming 310 the memristors includes changing or transitioning the digital-to-analog conversion mapping from a first mapping (e.g., a linear weight mapping) to a second mapping (e.g., a logarithmic weight mapping), and vice versa. Programming 310 the memristors that includes changing or transitioning the digital-to-analog conversion is equivalent to reprogramming and allows the digital-to-analog conversion mapping to be changed in situ, according to various examples.

Referring again to FIG. 6, the method 300 of digital-to-analog conversion further includes activating 320 a switch of the switched memristor array. Activating 320 the switch selects a programmed 310 memristor of the switched memristor array and establishes, according to the digital-to-analog conversion mapping, an analog resistance of the switched memristor array corresponding to a digital input. In particular, the digital input may provide activation 320 of the switch. For example, activating 320 a switch may include turning ON the switch to bypass the selected programmed 310 memristor as determined by the digital input. Which switch is activated 320 and turned ON may be dictated by the digital input, for example. In other examples, activating 320 a switch (e.g., according to the digital input) includes turning OFF the switch to enable the selected programmed 310 memristor to contribute a programmed resistance to and thus establish the analog resistance of the switched memristor array corresponding to the digital input. One or more of the switches of the switched memristor array may include a field effect transistor (FET) connected in parallel with corresponding one or more programmed 310 memristors. A source of the FET may be connected to a first terminal of the memristor and a drain of the FET may be connected to a second terminal of the memristor, for example. As such, activating 320 the FET switch may include turning OFF the FET by removing a bias voltage from a gate of the FET and turning ON the FET by applying the gate bias voltage, for example.

According to various examples, the method 300 of digital-to-analog conversion further includes generating 330 an analog output proportional to the established analog resistance. The generated 220 analog output is an analog representation of the digital input according to the digital-to-analog conversion mapping, according to various examples. According to some examples, the analog output is generated 330 by a resistance sensor or resistance-sensing circuit. The resistance sensor or resistance-sensing circuit may be substantially similar to either the resistance sensor 120 or the resistance-sensing circuit 220 described above with respect to the switched memristor DAC 100 and switched memristor DAC system 200, respectively. In particular, the resistance sensor or the resistance-sensing circuit may include, but is not limited to, one or both of a voltage sensor and a current sensor, according to various examples.

Thus, there have been described examples of a switched memristor digital-to-analog converter, a switched memristor digital-to-analog conversion system and a method of digital-to-analog conversion using a switched memristor array, each of which employ a set of switch-selectable programmed resistances to convert a digital input into an analog output. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A switched memristor digital to analog converter (DAC) comprising:
   a plurality of switched memristors connected in series to provide a set of switch-selectable programmed resistances, a switched memristor of the plurality comprising a memristor connected in parallel with a switch, the switch to select the memristor, the memristor having a programmable analog resistance to provide a programmed resistance of the set of switch-selectable programmed resistances,
   wherein the set of switch-selectable programmed resistances comprises predetermined programmed resistances to define a digital-to-analog conversion mapping, the switched memristor DAC to convert a digital input into a corresponding analog output according to the digital-to-analog conversion mapping.

2. The switched memristor DAC of claim 1, wherein the switch of the switched memristor comprises a field effect transistor (FET) with a source of the FET connected to a first terminal of the memristor and a drain of the FET connected to a second terminal of the memristor.

3. The switched memristor DAC of claim 1, wherein the digital-to-analog conversion mapping is a linear weighted mapping, the predetermined programmed resistances of the set of switch-selectable programmed resistances representing a binary linear weight sequence of resistances.

4. The switched memristor DAC of claim 1, wherein the digital-to-analog conversion mapping is a logarithmic weighted mapping, the predetermined programmed resistances of the set of switch-selectable programmed resistances representing a binary logarithmic weight sequence of resistances.

5. The switched memristor DAC of claim 1, further comprising a resistance sensor connected to the plurality of switched memristors to sense a resistance of the set of switch-selectable programmed resistances, the resistance sensor to provide the corresponding analog output of the switched memristor DAC as an output signal that is determined from the sensed resistance.

6. The switched memristor DAC of claim 5, wherein the resistance sensor comprises a voltage sensor to sense a voltage across the plurality of switched memristors, the voltage being proportional to the resistance of the set of switch-selectable programmed resistances, the output signal being proportional to the voltage.

7. The switched memristor DAC of claim 5, wherein the resistance sensor comprises a current sensor to sense a current flowing through the plurality of switched memristors, the current being proportional to the resistance of the set of switch-selectable programmed resistances, the output signal being proportional to the current.

8. The switched memristor DAC of claim 1, further comprising another switched memristor connected in series with the plurality of switched memristors, the other switched memristor to serve as a spare in the event of a failure of a switched memristor of the plurality of switched memristors.

9. A switched memristor digital-to-analog converter (DAC) system comprising:
a switched memristor array comprising a plurality of switch selectable memristors connected in series, the switched memristor array to provide a set of switch-selectable programmed resistances corresponding to a digital-to-analog conversion mapping; and
a resistance-sensing circuit connected to the switched memristor array both to sense an analog resistance of the set of switch-selectable programmed resistances corresponding to a digital input and the digital-to-analog conversion mapping and to provide an output signal determined from the sensed analog resistance,
wherein the sensed analog resistance is provided by both switch selection of a switch selectable memristor of the plurality corresponding to the digital input and a programmed resistance of the selected switch selectable memristor.

10. The switched memristor DAC system of claim 9, wherein a switch selectable memristor comprising a memristor and a field effect transistor (FET) connected in parallel with the memristor with a source of the FET being connected to a first terminal of the memristor and a drain of the FET being connected to a second terminal of the memristor.

11. The switched memristor DAC of claim 9, wherein the resistance-sensing circuit comprises a voltage sense amplifier to sense a voltage across the plurality of switch selectable memristors, the voltage being proportional to the analog resistance of the set of switch-selectable programmed resistances.

12. The switched memristor DAC of claim 9, wherein the digital-to-analog conversion mapping is a linear weighted mapping, the set of switch-selectable programmed resistances representing a linear weight sequence of resistances.

13. The switched memristor DAC of claim 9, further comprising another switch selectable memristor connected to the switched memristor array, the other switch selectable memristor to serve as a spare in the event of a failure of a switch selectable memristor of the switched memristor array.

14. A method of digital-to-analog conversion using a switched memristor array, the method comprising:
programming memristors of a switched memristor array with a set of switch-selectable programmed resistances to define a digital-to-analog conversion mapping;
activating a switch of the switched memristor array according to a digital input to establish according to the digital-to-analog conversion mapping an analog resistance of the switched memristor array corresponding to the digital input; and
generating an analog output proportional to the established analog resistance,
wherein the generated analog output is an analog representation of the digital input according to the digital-to-analog conversion mapping.

15. The method of digital-to-analog conversion of claim 14, wherein programming the memristors to define the digital-to-analog conversion mapping selects a set of predetermined analog resistances, the selected set of predetermined analog resistances represents one of a linear weight sequence of resistances of a linear weight mapping and a logarithmic weight sequence of resistances of a logarithmic weight mapping, the memristors being programmed according to the selected set of predetermined analog resistances.

* * * * *